(12) United States Patent
Fukuda et al.

(10) Patent No.: US 9,360,204 B2
(45) Date of Patent: Jun. 7, 2016

(54) LIGHT-EMITTING DEVICE

(71) Applicant: PANASONIC CORPORATION, Osaka (JP)

(72) Inventors: Toshiyuki Fukuda, Kyoto (JP); Yutaka Harada, Kyoto (JP); Hiroto Ohsaki, Kyoto (JP); Toshio Fujii, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 141 days.

(21) Appl. No.: 14/257,948

(22) Filed: Apr. 21, 2014

(65) Prior Publication Data

US 2014/0226308 A1    Aug. 14, 2014

Related U.S. Application Data

(63) Continuation of application No. PCT/JP2012/006139, filed on Sep. 26, 2012.

(30) Foreign Application Priority Data

Oct. 27, 2011   (JP) .................. 2011-235761

(51) Int. Cl.
*F21V 9/16*    (2006.01)
*F21V 31/00*   (2006.01)
(Continued)

(52) U.S. Cl.
CPC ................. *F21V 31/005* (2013.01); *F21K 2/00* (2013.01); *H01L 24/97* (2013.01); *H01L 33/507* (2013.01); *H01L 24/45* (2013.01); *H01L 33/62* (2013.01); *H01L 33/64* (2013.01); *H01L 2224/32225* (2013.01); *H01L 2224/45015* (2013.01); *H01L 2224/45124* (2013.01); *H01L 2224/45139* (2013.01); *H01L 2224/45144* (2013.01); *H01L 2224/45147* (2013.01);
(Continued)

(58) Field of Classification Search
CPC ............ H01L 2924/1204; H01L 24/97; F21V 31/005; F21K 2/00
USPC .......................... 362/84; 257/98–99
See application file for complete search history.

(56) References Cited

U.S. PATENT DOCUMENTS 6,294,800 B1 *  9/2001  Duggal .............. C09K 11/7734
                                                  257/100
6,308,818 B1   10/2001  Bonora et al.
(Continued)

FOREIGN PATENT DOCUMENTS

JP    61-119077 A     6/1986
JP    09-330789 A    12/1997
(Continued)

OTHER PUBLICATIONS

International Search Report issued in International Application No. PCT/JP2012/006139 with Date of mailing Oct. 30, 2012, with English Translation.

*Primary Examiner* — Ali Alavi
(74) *Attorney, Agent, or Firm* — McDermott Will & Emery LLP

(57) ABSTRACT

A light-emitting device includes a light-emitting element and a wavelength conversion layer. The light-emitting device further includes the translucent member having a translucent base and the wavelength conversion layer formed on the translucent base. The wavelength conversion layer does not contact the light-emitting element, and is sealed in the light-emitting device.

11 Claims, 10 Drawing Sheets

(51) Int. Cl.
   *H01L 33/50*   (2010.01)
   *H01L 23/00*   (2006.01)
   *F21K 2/00*    (2006.01)
   *H01L 33/62*       (2010.01)
   *H01L 33/64*       (2010.01)

(52) U.S. Cl.
   CPC ............ *H01L 2224/45565* (2013.01); *H01L 2224/48091* (2013.01); *H01L 2224/48227* (2013.01); *H01L 2224/73204* (2013.01); *H01L 2224/73265* (2013.01); *H01L 2224/97* (2013.01); *H01L 2924/12041* (2013.01); *H01L 2924/12042* (2013.01); *H01L 2924/15747* (2013.01)

(56) References Cited

U.S. PATENT DOCUMENTS

| | | | |
|---|---|---|---|
| 6,396,082 | B1 | 5/2002 | Fukasawa et al. |
| 6,621,211 | B1* | 9/2003 | Srivastava .......... C09K 11/7734 257/103 |
| 6,680,569 | B2* | 1/2004 | Mueller-Mach ...... H01L 33/504 313/501 |
| 2004/0104391 | A1* | 6/2004 | Maeda ................. C09K 11/025 257/79 |
| 2004/0129946 | A1 | 7/2004 | Nagai et al. |
| 2004/0257797 | A1 | 12/2004 | Suehiro et al. |
| 2005/0200269 | A1 | 9/2005 | Ng et al. |
| 2010/0103648 | A1 | 4/2010 | Kim et al. |
| 2011/0303940 | A1 | 12/2011 | Lee et al. |
| 2013/0334557 | A1 | 12/2013 | Uchida et al. |

FOREIGN PATENT DOCUMENTS

| | | |
|---|---|---|
| JP | 2000-001337 A | 1/2000 |
| JP | 2009-021303 A | 1/2002 |
| JP | 2002-094123 A | 3/2002 |
| JP | 2007-103512 A | 4/2007 |
| JP | 2007-317815 A | 12/2007 |
| JP | 2008-123969 A | 5/2008 |
| JP | 2009-071005 A | 4/2009 |
| JP | 2011-109010 A | 6/2011 |
| JP | 2012-138454 A | 7/2012 |
| WO | 2010/123059 A1 | 10/2010 |
| WO | 2011/016295 A1 | 2/2011 |
| WO | 2012/053386 A1 | 4/2012 |
| WO | 2012/123059 A1 | 9/2012 |

* cited by examiner

PART SURROUNDED BY DASHED LINE

FIG.9E PART SURROUNDED BY DASHED LINE

LIGHT-EMITTING DEVICE

CROSS-REFERENCE TO RELATED APPLICATIONS

This is a continuation of International Application No. PCT/JP2012/006139 filed on Sep. 26, 2012, which claims priority to Japanese Patent Application No. 2011-235761 filed on Oct. 27, 2011. The entire disclosures of these applications are incorporated by reference herein.

BACKGROUND

The present disclosure relates to a light-emitting device configured to convert the wavelength of light emitted from a light-emitting element such as light-emitting diodes (LEDs) to emit such light. In particular, the present disclosure relates to a light-emitting device preferably used for a backlight source of an electronic display or a fluorescent lamp.

In recent years, attention has been focused on semiconductor fluorescent particles as fluorescent materials used for the foregoing light-emitting devices, instead of using conventionally-used rare earth-activated fluorescent materials. The semiconductor fluorescent particles have characteristics which are not possessed by the conventional fluorescent materials, i.e., the characteristics that an emission wavelength can be optionally controlled. Thus, various emission spectrums can be realized by the light-emitting device using the semiconductor fluorescent particles. Expectation has been placed on such a technique as the technique for manufacturing light-emitting devices with high color rendering properties and high efficiency.

Study has been currently conducted on manufacturing of light-emitting devices including semiconductor light-emitting elements and semiconductor fluorescent particles as described above. Such a technique is disclosed in, e.g., Japanese Unexamined Patent Publication No. 2007-103512 (hereinafter referred to as "Patent Document 1"). Patent Document 1 discloses a light-emitting device formed using rare earth-activated fluorescent materials as blue and green fluorescent materials and using semiconductor fluorescent particles as yellow and red fluorescent materials.

SUMMARY

However, in the case where a wavelength conversion layer contains a fluorescent material susceptible to air and moisture, such as semiconductor fluorescent particles, the wavelength conversion layer is exposed to the outside in the configuration of the conventional light-emitting device described in Patent Document 1, and therefore there is a disadvantage that wavelength conversion efficiency of the semiconductor fluorescent particles is lowered due to air and moisture.

A light-emitting device of the present disclosure is a light-emitting device including a translucent member. Part of the translucent member is a wavelength conversion layer having a wavelength conversion function, and the wavelength conversion layer is isolated by a laminate material or a protective layer so as not to be exposed to air. Thus, even if a wavelength conversion layer having low oxidation resistance and low moisture resistance is used, lowering of wavelength conversion efficiency is reduced in the light-emitting device.

Specifically, The light-emitting device of the present disclosure is a light-emitting device including a light-emitting element and a wavelength conversion layer. The light-emitting device includes a translucent member including a translucent base and the wavelength conversion layer formed on the translucent base. The wavelength conversion layer does not contact the light-emitting element, and is sealed in the light-emitting device.

The wavelength conversion layer may contain semiconductor fluorescent particles.

The light-emitting device may further include a frame body formed with a recess. The light-emitting element may be mounted in the recess, and the translucent member may be mounted on the frame body so as to cover the recess.

The wavelength conversion layer may contact an upper surface of the frame body.

The translucent member may be bonded to the frame body with an adhesive material, and a side surface of the wavelength conversion layer may be covered by the adhesive material.

A cutout may be formed in an end part of the translucent base.

The cutout may be filled with the adhesive material.

The recess may be filled with gas other than oxygen.

The translucent member may include a barrier layer, and the barrier layer may be formed on a side of the wavelength conversion layer opposite to the translucent base.

The wavelength conversion layer may be sealed with the translucent base and the barrier layer.

The translucent base may be a translucent circuit board, and the light-emitting element may be electrically connected to an interconnection formed on the translucent base.

A through-hole may be formed in the translucent base, the through-hole may be filled with the wavelength conversion layer, and a heat dissipation pattern may be formed on the translucent base so as to cover the through-hole.

The light-emitting element may be bonded to the translucent member, and a side surface of the light-emitting element and a side surface of the translucent member may be flush with each other.

A heat dissipation pattern may be formed on the light-emitting element.

A cured layer may be formed at a side surface of the wavelength conversion layer.

According to the light-emitting device of the present disclosure, even in a light-emitting device using a wavelength conversion layer containing a material(s) with low oxidation resistance and low moisture resistance, degradation of the wavelength conversion layer can be reduced. Moreover, since the translucent base forming the translucent member is made from a flat plate, light-emitting devices can be manufactured with high mass productivity.

BRIEF DESCRIPTION OF THE DRAWINGS

FIGS. 9A-9E are views illustrating the method for manufacturing the light-emitting device of the fourth embodiment of the present disclosure.

DETAILED DESCRIPTION

Embodiments of the present disclosure will be described with reference to drawings.

First Embodiment

Figure 1A:
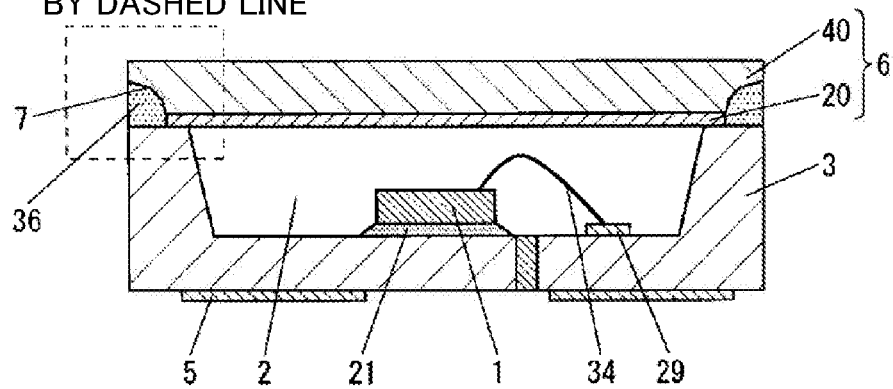
FIGS. 1A-1I are cross-sectional views illustrating a light-emitting device of a first embodiment of the present disclosure and enlarged views of part of the light-emitting device of the first embodiment of the present disclosure.

FIG. 1A is a cross-sectional view illustrating a light-emitting device of a first embodiment of the present disclosure.

A frame body 3 is formed so as to have a bottom part and a surrounding part thereof, and a recess 2 is formed at a center part of the frame body 3. A first terminal 5 is provided on an outer bottom of the frame body 3. The frame body 3 opens upward in the recessed structure, and a light-emitting element 1 is mounted on an inner bottom of the frame body 3 forming the recess 2. For example, a GaN-based blue LED may be used as the light-emitting element 1. However, the light-emitting element 1 is not limited to such an LED, and blue LEDs made of other materials, LEDs emitting light of other colors, or light-emitting elements (e.g., organic ELs) other than LEDs may be used. The inner bottom of the frame body 3 forming the recess 2 and the light-emitting element 1 are bonded together with a die bonding material 21. The light-emitting element 1 and a second terminal 29 provided in the recess 2 are electrically connected together through a connection member 34. A first translucent member 6 is placed on the frame body 3 so as to close the opening of the recess 2. The first translucent member 6 is fixed to the frame body 3 with an adhesive material 36. The first translucent member 6 includes a flat plate-shaped translucent base 40 and a wavelength conversion layer 20. The wavelength conversion layer 20 is formed on a surface of the translucent base 40 close to the recess opening (i.e., close to the light-emitting element 1). It is preferred that part of the wavelength conversion layer 20 and the upper surface of the frame body 3 contact each other. The entirety of a side surface of the wavelength conversion layer 20 and part of a side surface of the translucent base 40 are covered by the adhesive material 36 such that the wavelength conversion layer 20 is sealed in the light-emitting device, and therefore the wavelength conversion layer 20 is not exposed to the outside of the light-emitting device (i.e., not exposed to external air). Since the wavelength conversion layer 20 is sealed as just described, airtightness can be ensured even for a wavelength conversion layer of a light-emitting device having low oxidation resistance and low moisture resistance. As a result, lowering of the oxidation resistance and the moisture resistance of the wavelength conversion layer can be reduced, and the light-emitting device can be manufactured with high quality.

For example, a wavelength conversion layer which contains semiconductor fluorescent particles producing high quantum efficiency by direct application of band-edge absorption and band-edge emission is preferable as the wavelength conversion layer 20. More specifically, the wavelength conversion layer 20 preferably contains a quantum-dot fluorescent material. The quantum-dot fluorescent material contains particles with a size of several to several tens of nanometers, and expectation has been placed on the quantum-dot fluorescent material as a new fluorescent material. Even if the same type of quantum-dot fluorescent material is used, the particle size thereof can be, using a quantum size effect, controlled to obtain a desired wavelength range of a fluorescence spectrum within a visible light range. Since the band-edge absorption and the band-edge emission are used, a high external quantum efficiency of about 90% can be realized. Thus, a light-emitting device with high efficiency and high color rendering properties can be provided. The quantum-dot fluorescent material may be preferably selected from the group consisting of, e.g., II-VI compound semiconductor nanocrystals such as CdS, CdSe, CdTe, ZnS, ZnSe, ZnTe, HgS, HgSe, and HgTe, III-V compound semiconductor nanocrystals such as GaN, GaP, GaAs, AlN, AlP, AlAs, InN, InP, and InAs, and a mixture thereof. The mixture may be preferably selected from the group consisting of, e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe. Alternatively, the mixture may be preferably selected from the group consisting of, e.g., GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs.

Suppose that a GaN-based blue LED is used as the light-emitting element 1, and an II-VI compound semiconductor nanocrystal such as CdS, CdSe, CdTe, ZnS, ZnSe, and ZnTe and an III-V compound semiconductor nanocrystal such as GaN, GaP, AlN, AlP, AlAs, InN, and InP are used as the semiconductor fluorescent particles contained in the wavelength conversion layer 20. In this case, the light-emitting device configured to emit high-brightness white light can be provided.

In the first embodiment of the present disclosure, the wavelength conversion layer 20 is exposed in the recess 2. Thus, if the wavelength conversion layer 20 has extremely-low oxidation resistance, the recess 2 is preferably vacuumed or filled with inert gas or gas whose oxygen concentration is controlled. Alternatively, the recess 2 is preferably filled with a transparent material such as silicone or grease.

The material of each part will be described below in detail.

The frame body 3 formed with the recess 2 can be formed to have high airtightness and high heat dissipating properties in such a manner that a plurality of frame bodies 3 are integrally formed from a metal base made of, e.g., a Cu alloy, Fe—Ni, and Al. In order to form the recesses 2, it is necessary that metal base parts to be the recesses 2 are punched out by, e.g., a press mold.

The method for forming only the first terminal 5 from metal and forming the frame body 3 from resin may be employed as another method for forming the frame body 3 formed with the recess 2. In this case, the frame body 3 may be, together with a lead frame, formed using a mold for resin sealing. A Cu alloy optionally plated with Ni—Au, Ag, or solder is used to form the first terminal 5.

The connection member 34 electrically connecting between the light-emitting element 1 and the second terminal 29 formed inside the recess 2 may be a protruding electrode or a thin metal wire. In the case of the protruding electrode, e.g., an Au bump (e.g., a plated bump or a stud bump) or a solder plated bump (e.g., a Sn—Ag—Cu bump) may be applicable. In the case of the thin metal wire, any one of, e.g., an Au wire, an Al wire, an Ag wire, or a Cu wire may be selected. Since the Ag wire and the Cu wire are susceptible to oxidation, e.g., any of the following processes for preventing oxidation is required: the process for forming a coating on the wire; the process for using, e.g., inert gas to adjust gas inside the recess 2 of the light-emitting device; and the process for covering the wire with an inorganic material after connection between the light-emitting element 1 and the second terminal 29. Various wire diameters may be applicable. However, it is necessary that a light-emitting device for which size reduction is required has a wire diameter of φ10-20 μm. The depth of the recess 2 of the frame body 3 described above is determined depending on the thickness of the light-emitting element 1 and the connection member 34 electrically connected to the light-emitting element 1. The depth of the recess 2 may be basically set so that a thickness of 50-200 μm can be ensured for the light-emitting element 1. If the connection member 34 is the protruding electrode, a depth of 10-20 μm is additionally required. On the other hand, if the connection member 34 is the thin metal wire, a recess depth of about 100 μm is required at the minimum in addition to a light-emitting element thickness of 50-200 μm. That is, a recess depth of equal to or greater than 100-400 μm is required.

The reason why part of the wavelength conversion layer 20 and the upper surface of the frame body 3 contact each other is to dissipate heat. In the case where the wavelength conversion layer 20 contains the semiconductor fluorescent particles, there is a disadvantage that heat is accumulated in the wavelength conversion layer 20 having low heat resistance. However, heat dissipation can be optimized in such a manner that a contact area is adjusted by a thermal design.

The translucent base 40 of the first translucent member 6 is made of, e.g., glass, transparent resin, a transparent film, or a transparent sheet. For example, glasses used for an optical system, such as resin glass, molded glass, acrylic glass, and crystal glass, may be mainly used as the glass. Considering transparency and other properties, the transparent resin may be optionally selected from resins having transparency, such as acrylic resin, acrylonitrile butadiene styrene (ABS) resin, and polyacetal resin. For example, a polycarbonate (PC) film or a polyolefin-based film may be used as the transparent film or sheet. Considering transparency and other properties, the transparent film or sheet may be optionally selected from films made of fluorocarbon resin, such as an ethylene tetrafluoroethylene (ETFE) film, an ionomer (IO) film, a polypropylene (PP) film, a polyester film, a polystyrene (PS) film, and a polyacrylonitrile (PAN) film.

In addition to the wavelength conversion layer made of, e.g., organic resin containing semiconductor fluorescent particles, the first translucent member 6 may include, e.g., an alpha-ray blocking film, a wavelength blocking film, and/or an antireflective film. A mixture of inorganic/organic resin and powder of, e.g., titanium oxide, magnesium fluoride, aluminum oxide, zirconium oxide, tantalum oxide, or silicon dioxide is used for the antireflective film. In the case of the alpha-ray blocking film or the wavelength blocking film, examples of the method for vapor-depositing an alpha-ray blocking film or a wavelength blocking film on glass or a film include sputtering and electron beam deposition. A mixture of inorganic/organic resin, tin-doped indium oxide (ITO), and antimony tin oxide (ATO) is used for the alpha-ray blocking film and the wavelength blocking film.

FIGS. 1B-1E are enlarged cross-sectional views illustrating variations in circumferential edge part of the first translucent member 6 surrounded by a dashed line illustrated in FIG. 1A.

According to the present embodiment, a cutout 7 is formed in the circumferential edge part of the first translucent member 6. The cutout 7 is preferably in an arc shape or a step shape. The wavelength conversion layer 20 is not formed in the arc-shaped or step-shaped cutout 7, and the side surface of the wavelength conversion layer 20 exposed in the cutout 7 is completely covered by the adhesive material 36.

Figure 1B:
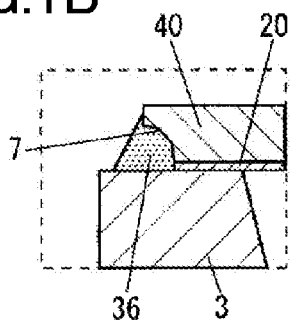

Referring to FIG. 1B, in the first translucent member 6 in which the wavelength conversion layer 20 is formed so as to face the recess 2, the arc-shaped cutout 7 is formed at a circumferential edge of the first translucent member 6. The arc-shaped cutout 7 is positioned so as to face the frame body 3. The cutout 7 is filled with the adhesive material 36 to seal an end part of the wavelength conversion layer 20. The arc-shaped cutout 7 increases a contact area between the adhesive material 36 with which the cutout 7 is filled and the first translucent member 6. This brings about an anchor effect.

Figure 1C:
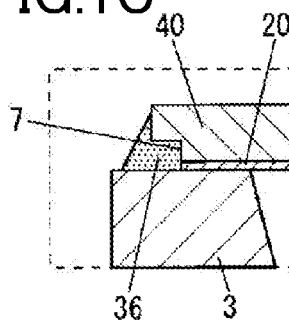

Referring to FIG. 1C, the cutout 7 which is in the arc shape in FIG. 1B is in the step shape. The shape of the cutout 7 can be changed between the arc shape and the step shape in such a manner that the edge shape of a blade used upon processing is changed (see FIGS. 2A-2C). In the case where the translucent base 40 of the first translucent member 6 is susceptible to cracking, not the step-shaped cutout 7 but the arc-shaped cutout 7 may be used.

Figure 1D:
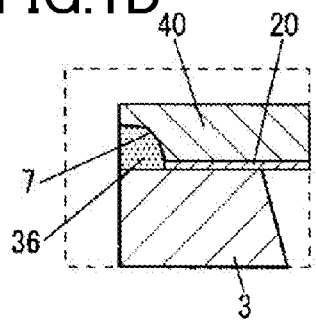
Figure 1E:
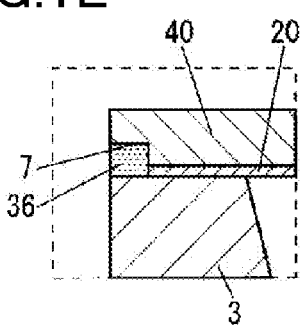

FIG. 1D is similar to FIG. 1B in that the arc-shaped cutout 7 is formed at the circumferential edge of the first translucent member 6, and FIG. 1E is similar to FIG. 1C in that the step-shaped cutout 7 is formed at the circumferential edge of the first translucent member 6. However, in order to further reduce the size of the light-emitting device, a side surface of the first translucent member 6, a side surface of the adhesive material 36, and a side surface of the frame body 3 are flush with each other.

Thus, FIGS. 1B-1E are different from each other in the method for manufacturing the light-emitting device. The light-emitting devices illustrated in FIGS. 1B and 1C can be manufactured in such a manner that each of the separate first translucent members 6 is sealed after such a first translucent member 6 is mounted on a corresponding one of the recessed frame bodies 3. On the other hand, the light-emitting devices illustrated in FIGS. 1D and 1E can be manufactured in such a manner that an integrated body of a plurality of first translucent members 6 is sealed after being mounted on an integrated body of the frame bodies 3 and then is divided into the separate light-emitting devices.

Figure 1F:
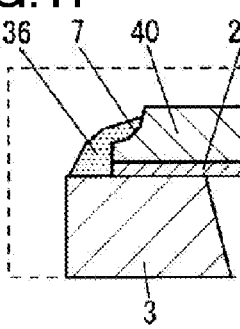
Figure 1G:
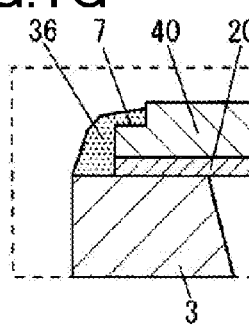

FIGS. 1F and 1G are enlarged cross-sectional view illustrating other variations in circumferential edge part of the first translucent member 6 surrounded by the dashed line illustrated in FIG. 1A.

The arc-shaped or step-shaped cutout 7 is formed at a circumferential edge part of a surface of the first translucent member 6 opposite to the frame body 3. Part of the arc-shaped or step-shaped cutout 7 and the entirety of a unprocessed part of the side surface of the first translucent member 6 are covered by the adhesive material 36.

Advantages of the variations illustrated in FIGS. 1F and 1G are as follows. That is, if the thickness of the first translucent member 6 is reduced, it is difficult to ensure bonding strength between the first translucent member 6 and the frame body 3 in the variations illustrated in FIGS. 1B-1E. For such a reason, the first translucent member 6 is placed on the frame body 3 such that the arc-shaped or step-shaped cutout 7 faces upward, and the arc-shaped or step-shaped cutout 7 is filled with the adhesive material 36. Thus, the bonding strength between the first translucent member 6 and the frame body 3 can be ensured, and the end part of the wavelength conversion layer 20 can be easily sealed.

Figure 1H:
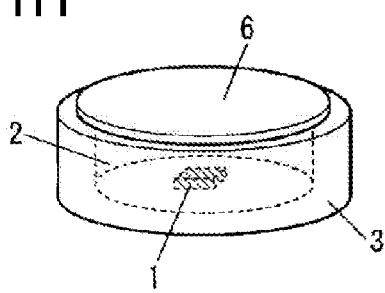
Figure 1I:
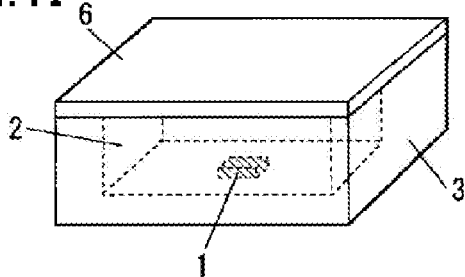

FIGS. 1H and 1I are schematic perspective views of the light-emitting device of the first embodiment of the present disclosure.

FIG. 1H illustrates the light-emitting device having a circular outer shape. In such a case, the variations illustrated in FIGS. 1B, 1C, 1F, and 1G are applicable to the first translucent member 6. That is, it is necessary that a first translucent member slightly smaller than a frame body of a light-emitting device is bonded to the frame body. If the light-emitting device has a circular outer shape, light-emitting properties may be enhanced. Depending on a substrate on which the light-emitting device is mounted, the circular light-emitting device may be required.

FIG. 1I illustrates the light-emitting device having a rectangular outer shape. In such a case, the variations illustrated in FIGS. 1B-1G is applicable to the first translucent member 6. That is, the first translucent member 6 may be slightly smaller than the frame body 3 of the light-emitting device, or may have the same size as that of the frame body 3 of the light-emitting device. If the first translucent member 6 is slightly smaller than the frame body 3 of the light-emitting device, the separate first translucent members 6 may be bonded respectively to the frame bodies 3 before or after division of the frame bodies 3 of the light-emitting devices. If the first translucent member 6 has the same size as that of the frame body 3 of the light-emitting device, the method for dividing the first translucent members 6 at the same time as (or right before) division of the frame bodies 3 of the light-emitting devices is employed. The translucent base 40 is optionally designed to have a thickness of 10-200 µm, and the wavelength conversion layer 20 is optionally designed to have a thickness of 0.01-50 µm. In particular, the first translucent member 6 may include, as described above, the alpha-ray blocking film, the wavelength blocking film, and/or the antireflective film in addition to the wavelength conversion layer made of, e.g., organic resin containing the semiconductor fluorescent particles, and there is a wide variety of first translucent members 6. Thus, the thickness and the material vary depending on desired material properties.

In the light-emitting device of the first embodiment of the present disclosure, the translucent base 40 is made from a flat plate, resulting in high mass productivity as described below.

The method for manufacturing the light-emitting device of the first embodiment of the present disclosure will be described with reference to FIGS. 2A-2C and 3A-3D.

Figure 2A:
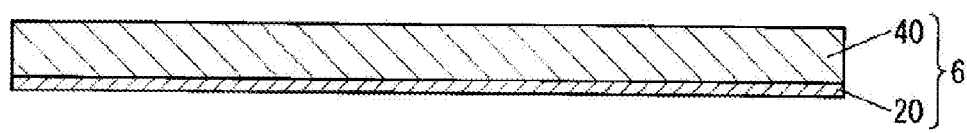
FIGS. 2A-2C are views illustrating the method for forming a translucent member used for the light-emitting device of the first embodiment of the present disclosure.
Figure 2B:
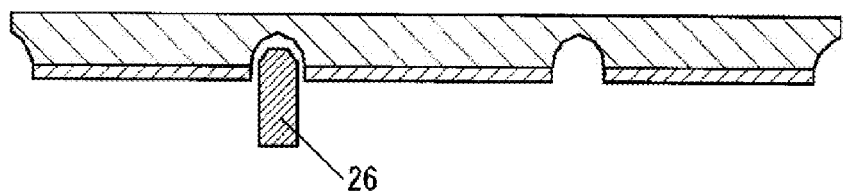
Figure 2C:
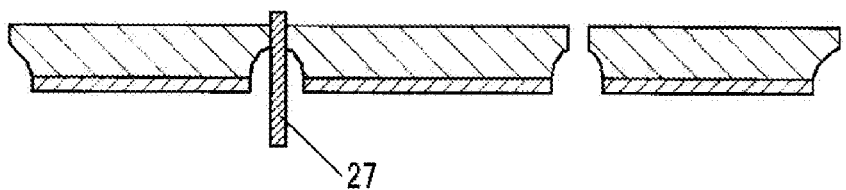

FIGS. 2A-2C are cross-sectional views illustrating the method for forming the wavelength conversion layer 20 on the translucent base 40 according to the first embodiment of the present disclosure. In particular, such a method is for forming the shapes illustrated in FIGS. 1B-1E.

Referring to FIG. 2A, a flat plate to be translucent bases 40 is prepared, and a wavelength conversion layer 20 is formed on one surface of the flat plate of the translucent bases 40. Then, referring to FIG. 2B, arc-shaped or step-shaped cutouts are formed at positions corresponding to frame bodies of light-emitting devices on a side close to the wavelength conversion layer 20. In this state, processing using a first blade 26 is so-called "half-cutting." The wavelength conversion layer 20 is completely divided, but the flat plate of the translucent bases 40 is not completely cut off. Finally, referring to FIG. 2C, the flat plate of the translucent bases 40 is completely cut off along each cutout with a second blade 27 having a smaller width than that of the first blade 26. As just described, translucent members each including a wavelength conversion layer can be formed.

For the shapes illustrated in FIGS. 1E and 1F, the arc-shaped or step-shaped cutouts may be formed using the first blade 26 on a side opposite to the wavelength conversion layer 20.

FIGS. 3A-3D are cross-sectional views illustrating the method for manufacturing the light-emitting device of the first embodiment of the present disclosure.

Figure 3A:
FIGS. 3A-3D are views illustrating the method for manufacturing the light-emitting device of the first embodiment of the present disclosure.

First, referring to FIG. 3A, an integrated body of a plurality of frame bodies 3 each formed with a recess 2 is prepared.

Figure 3B:
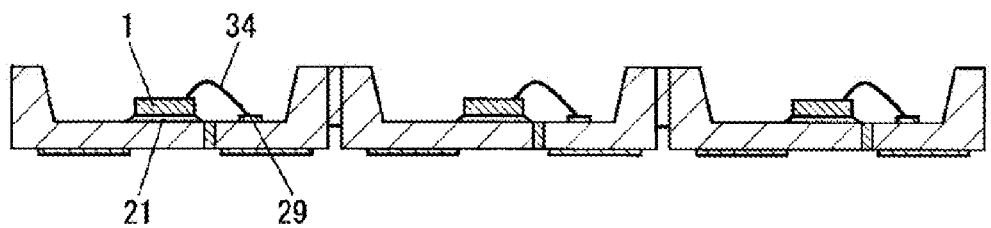

Then, referring to FIG. 3B, a light-emitting element 1 is, with a die bonding material 21, fixed to an inner bottom of each frame body 3 forming the recess 2. Further, the light-emitting element 1 and a second terminal 29 provided on the inner bottom of the frame body 3 forming the recess 2 are electrically connected through a connection member 34.

Figure 3C:
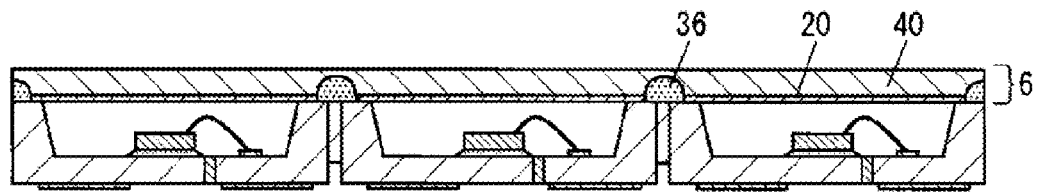

Then, referring to FIG. 3C, an integrated body of first translucent members 6 each including a wavelength conversion layer 20 is bonded to the integrated body of the frame bodies 3 such that connection parts of the frame bodies 3 of light-emitting devices corresponds respectively to arc-shaped or step-shaped cutouts. In this case, the half-cut integrated body of the first translucent members 6 after the step illustrated in FIG. 2B is used. In this state, each cutout of the integrated body of the first translucent members 6 is filled with an adhesive material 36, and the integrated body of the first translucent members 6 and the integrated body of the frame bodies 3 are bonded together with the adhesive material 36. As a result, the integrated body of the first translucent members 6 each including the wavelength conversion layer 20 and the integrated body of the frame bodies 3 each formed with the recess 2 are sealed.

Figure 3D:
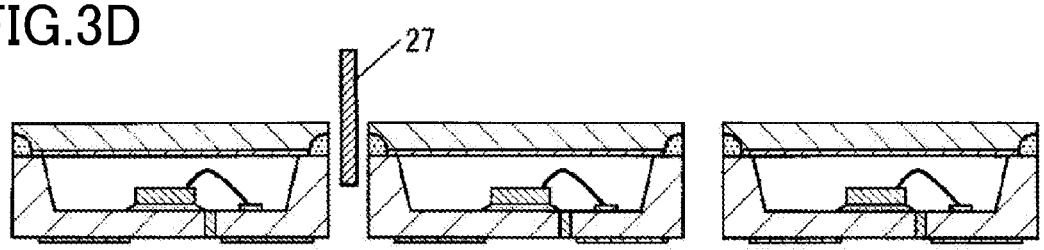

Finally, referring to FIG. 3D, the bonded body is divided, in which the integrated body of the first translucent members 6 each including the wavelength conversion layer 20 and the integrated body of the frame bodies 3 each formed with the recess 2 are bonded together. A blade (rotary blade) 27 used for, e.g., so-called "package dicing" is used for division. A material formed by solidifying diamond grains with a bonding material is used for the blade 27. The width of the blade 27 is 20-100 µm. While cutting water is running on a cut part, the blade 27 rotates at a high speed of 10000-50000 rpm to cut the bonded body at a speed of 5-300 mm/s. The blade 27 cuts the bonded body at the position corresponding each cutout of the integrated body of the first translucent members 6.

The integrated body of the frame bodies 3 and the integrated body of the first translucent members 6 may be simultaneously divided with the blade 27. Alternatively, the integrated body of the frame bodies 3 may be first divided, and then the separate first translucent members 6 after the step illustrated in FIG. 2C may be mounted respectively on the separate frame bodies 3.

As illustrated in FIGS. 2A-2C and 3A-3D, since the translucent base 40 is made from the flat plate, the translucent members 6 each including the wavelength conversion layer 20 can be formed at once, and therefore the light-emitting devices can be provided with high mass productivity.

Second Embodiment

Figure 4:
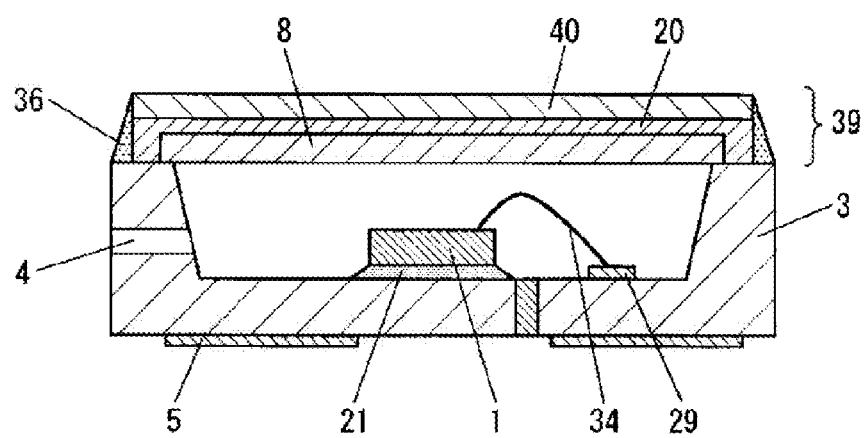
FIG. 4 is a cross-sectional view illustrating a light-emitting device of a second embodiment of the present disclosure.

FIG. 4 is a cross-sectional view illustrating a light-emitting device of a second embodiment of the present disclosure.

The second embodiment is different from the first embodiment mainly in the configuration of a translucent member, and other configuration of the second embodiment is the same as that of the first embodiment.

A frame body 3 is formed with a recess 2 surrounded by the frame body 3. A first terminal 5 is provided on an outer bottom of the frame body 3. The recess 2 opens upward, and a light-emitting element 1 is mounted on an inner bottom of the frame body 3 forming the recess 2. The light-emitting element 1 and a second terminal 29 disposed on the inner bottom of the frame body 3 forming the recess 2 are electrically connected together through a connection member 34. A second translucent member 39 is disposed on the frame body 3 so as to close the opening of the recess 2. The second translucent member 39 and the frame body 3 are fixed together with an adhesive material 36. The second translucent member 39 includes a barrier layer 8, a wavelength conversion layer 20 formed on an upper surface of the barrier layer 8, and a flat plate-shaped translucent base 40 provided on an upper surface of the wavelength conversion layer 20. The wavelength conversion layer 20 is in such a shape that the wavelength conversion layer 20 covers a side surface of the barrier layer 8. The upper surface of the wavelength conversion layer 20 is covered by the translucent base 40, and a side surface of the wavelength conversion layer 20 is covered by the adhesive material 36. Further, part of the wavelength conversion layer 20 and an upper surface of the frame body 3 contact each other. Thus, the wavelength conversion layer 20 is sealed in the light-emitting device with the barrier layer 8, the translucent base 40, the adhesive material 36, and the upper surface of the frame body 3, and is not exposed to the outside of the light-emitting device (i.e., not exposed to external air). Since the wavelength conversion layer 20 is sealed as just described, airtightness can be ensured even for a wavelength conversion layer of a light-emitting device having low oxidation resistance and low moisture resistance. As a result, lowering of the oxidation resistance and the moisture resistance of the wavelength conversion layer can be reduced, and the light-emitting device can be manufactured with high quality.

Particularly in the second embodiment, since the wavelength conversion layer 20 is sealed with the barrier layer 8 even in the recess 2, it is not necessary that the recess 2 is filled with, e.g., inert gas as described in the first embodiment. Unlike the first embodiment, a relief hole 4 may be, if necessary, formed at a predetermined part of the frame body 3 to dissipate moisture or heat.

FIGS. 5A-5D are cross-sectional views illustrating the steps of forming the second translucent member 39 of the second embodiment of the present disclosure.

Figure 5A:
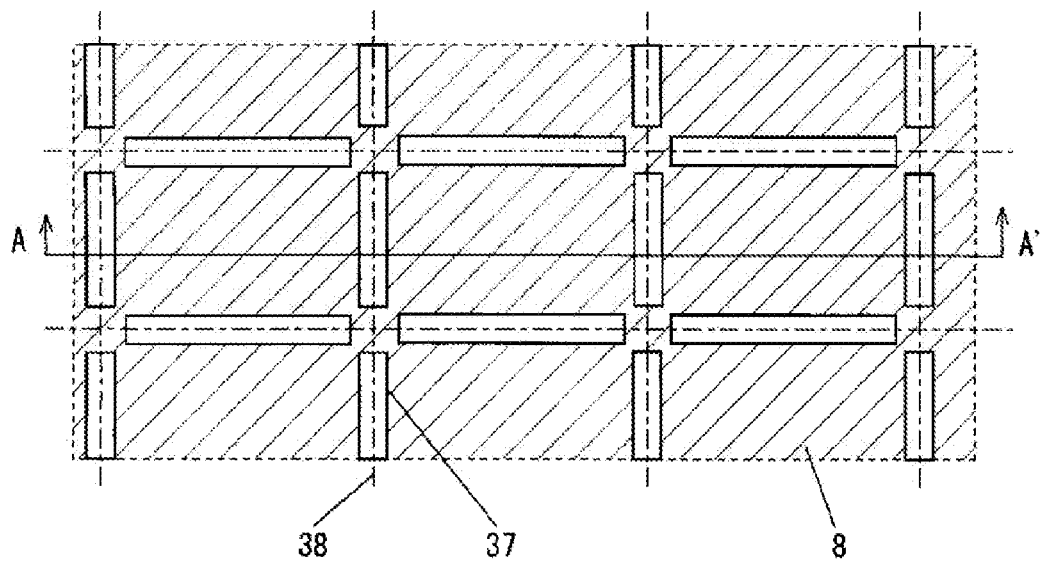
FIGS. 5A-5D are views illustrating the method for forming a translucent member used for the light-emitting device of the second embodiment of the present disclosure.
Figure 5B:
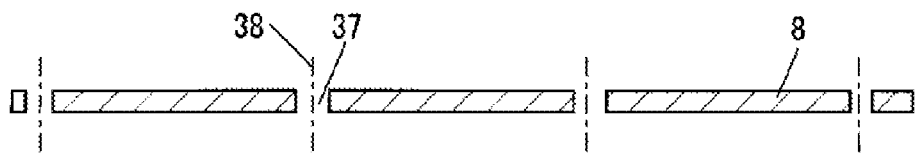

First, referring to FIG. 5A, a flat plate to be barrier layers 8 is prepared. FIG. 5B is a cross-sectional view along an AA' line illustrated in FIG. 5A. Referring to FIG. 5B, each slit 37 is formed on a corresponding one of division line 38, i.e., a region where the flat plate is divided into the barrier layers 8.

Figure 5C:
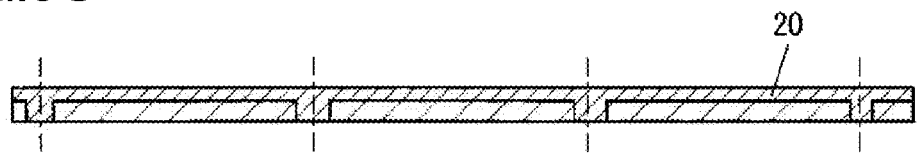

Next, referring to FIG. 5C, a wavelength conversion layer 20 is formed so as to extend across the entirety of an upper surface of the flat plate of the barrier layers 8 and to enter the slits 37.

Figure 5D:

Then, referring to FIG. 5D, a flat plate to be translucent bases 40 is provided on an upper surface of the wavelength conversion layer 20. Subsequently, the flat plate of the barrier layers 8 on which the wavelength conversion layer 20 and the flat plate of the translucent bases 40 are provided is divided into pieces along the division lines 38.

As just described, second terminals 29 is formed, in each of which the entirety of the upper surface of the wavelength conversion layer 20 is covered and side and bottom surfaces of the wavelength conversion layer 20 are partially exposed.

The method similar to that illustrated in FIGS. 3A-3D or the method for mounting, on each of separate frame bodies 3, a corresponding one of the separate second translucent members 39 after the step illustrated in FIG. 5D may be employed as the method for bonding the second translucent member 39 to the frame body 3.

In the present embodiment, since the translucent base 40 is also made from the flat plate, the translucent members 39 each including the wavelength conversion layer 20 can be formed at once, and therefore the light-emitting devices can be provided with high mass productivity.

Third Embodiment

Figure 6A:
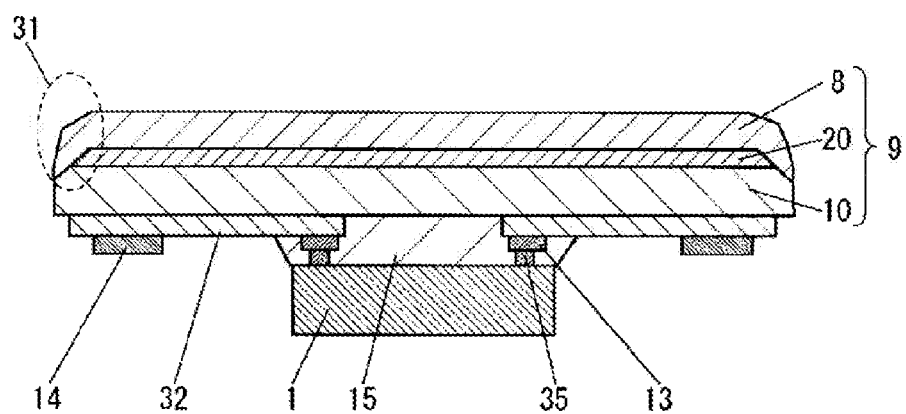
FIGS. 6A and 6B are cross-sectional views illustrating a light-emitting device of a third embodiment of the present disclosure.

FIG. 6A is a cross-sectional view illustrating a light-emitting device of a third embodiment of the present disclosure.

In the present embodiment, a light-emitting element 1 is, through protruding electrodes 35, directly connected to a flat plate-shaped translucent circuit board (translucent base) 10.

Thus, as compared to the first and second embodiments, the thickness of the light-emitting device of the third embodiment can be reduced.

Interconnections 32 are provided on one surface of the translucent circuit board 10. The light-emitting element 1 is mounted on the surface of the translucent circuit board 10 on which the interconnections 32 are provided. A protruding electrode connection part 13 is provided on each interconnection 32 of the translucent circuit board 10. The protruding electrodes 35 are provided on the light-emitting element 1, and each protruding electrode 35 is electrically connected to a corresponding one of the protruding electrode connection parts 13. A space between the light-emitting element 1 and the translucent circuit board 10 is filled with a transparent underfill material 15. An OUT-IN connection part 14 is arranged in a region of the interconnection 32 outside the region where the protruding electrode connection part 13 is disposed. A wavelength conversion layer 20 is formed on a surface of the translucent circuit board 10 opposite to the interconnections 32. The entirety of an upper surface of the wavelength conversion layer 20 is covered by a barrier layer 8, and a circumferential edge of the wavelength conversion layer 20 is covered by a sagging part 31 of the barrier layer 8 such that the translucent circuit board 10 and the barrier layer 8 partially overlap with each other without the wavelength conversion layer 20 being exposed. The barrier layer 8 is made of, e.g., resin or a film.

The translucent circuit board 10, the wavelength conversion layer 20, and the barrier layer 8 form a translucent member 9.

For the light-emitting element 1, the translucent base (translucent circuit board) 10, and the wavelength conversion layer 20, the materials etc. described in the first and second embodiments may be used.

The entirety of the wavelength conversion layer 20 is covered by the translucent circuit board 10 and the barrier layer 8 so as to be sealed in the light-emitting device, and therefore the wavelength conversion layer 20 is not exposed to the outside of the light-emitting device (i.e., not exposed to external air). Since the wavelength conversion layer 20 is sealed as just described, airtightness can be ensured even for a wavelength conversion layer of a light-emitting device having low oxidation resistance and low moisture resistance. As a result, lowering of the oxidation resistance and the moisture resistance of the wavelength conversion layer can be reduced, and the light-emitting device can be manufactured with high quality.

Figure 6B:
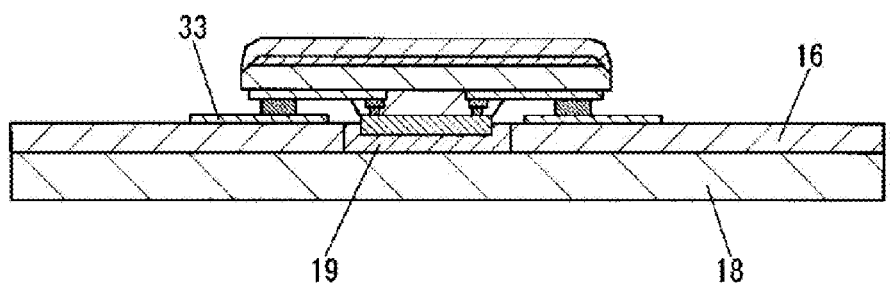

FIG. 6B is a view illustrating the state in which the light-emitting device of the third embodiment of the present disclosure is mounted on a mount board (substrate) 16. Interconnections 33 are formed on the mount board 16. Examples of the interconnection 33 include a Cu interconnection. Part of the mount board 16 in which the light-emitting element 1 of the light-emitting device is to be housed is removed, and a heat sink 18 (e.g., an aluminum substrate or a Cu substrate) having high heat dissipating properties is bonded to a surface of the mount board 16 opposite to the interconnections 33. Since the heat sink 18 directly dissipates heat generated from the light-emitting element 1, the removed part of the mount board 16 is filled with a heat dissipating material 19 (e.g., grease), and the aluminum substrate 18 and a rear surface of the light-emitting element 1 are connected together through the heat dissipating material 19.

The interconnections on the mount board 16, the interconnections of the light-emitting device, and a soldered part of the light-emitting device may be plated with Ni—Au.

FIGS. 7A-7G are views illustrating the method for manufacturing the light-emitting device of the third embodiment of the present disclosure.

Figure 7A:
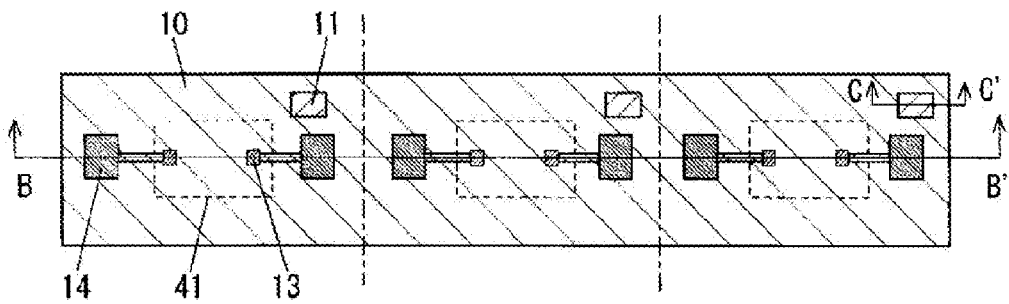
FIGS. 7A-7G are views illustrating the method for forming a translucent circuit board used for the light-emitting device of the third embodiment of the present disclosure.

FIG. 7A is the view illustrating a state in the middle of a manufacturing process, and is a back view of an integrated body of a plurality of translucent circuit boards 10 each including interconnections on one surface thereof. An element mount region 41 is formed at the center of each translucent circuit board 10. The protruding electrode connection part 13 is provided on the interconnection 32 within the element mount region 41. Moreover, the OUT-IN connection part 14 is provided on the interconnection 32 so as to be electrically connected to the protruding electrode connection part 13.

The translucent circuit board 10 preferably includes a heat dissipation interconnection pattern 11.

Figure 7B:
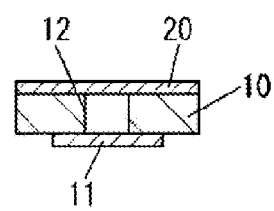
Figure 7C:
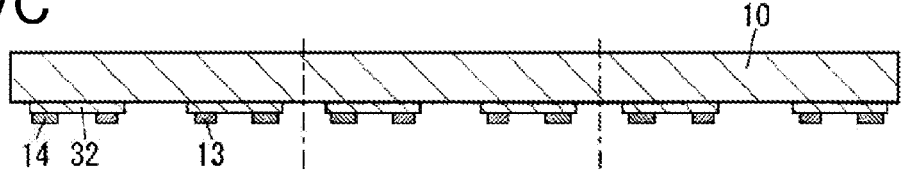

FIG. 7B is the cross-sectional view along a CC' line illustrated in FIG. 7A. A through-hole 12 is formed corresponding to the heat dissipation interconnection pattern 11 in the translucent circuit board 10. The through-hole 12 is filled with the same material as that of the wavelength conversion layer 20. The wavelength conversion layer 20 is connected to the heat dissipation interconnection pattern 11 through the through-hole 12. According to such a design, if it is necessary to dissipate heat accumulated in the wavelength conversion layer 20, a heat dissipation pattern is optionally formed in a desired region so that heat can be efficiently dissipated.

FIGS. 7C-7G are the cross-sectional views along a BB' line illustrated in FIG. 7A. First, referring to FIG. 7C, an integrated body of a plurality of translucent circuit boards 10 each including interconnections 32 on one surface thereof is prepared.

Figure 7D:
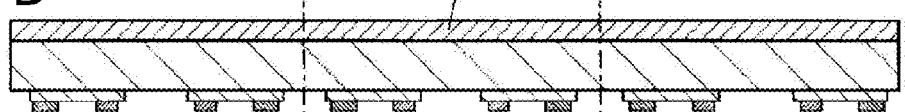

Next, referring to FIG. 7D, a wavelength conversion layer 20 is formed on a surface of the integrated body of the translucent circuit boards 10 opposite to the interconnections 32. Note that FIG. 7A illustrates this state.

Figure 7E:
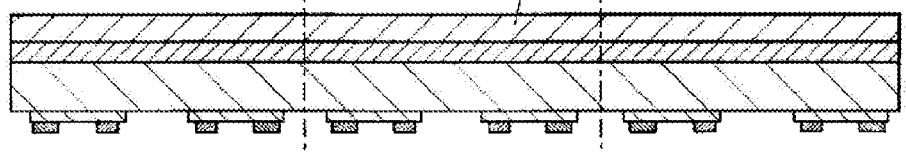

Then, referring to FIG. 7E, an upper surface of the wavelength conversion layer 20 is covered by a barrier layer 8.

Figure 7F:
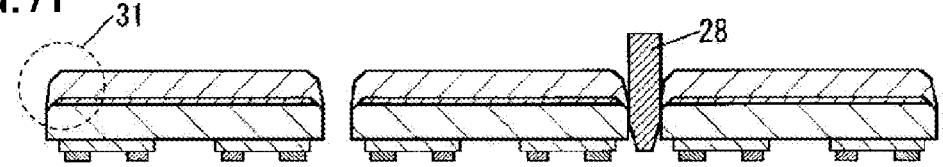

Next, referring to FIG. 7F, the integrated body of the translucent circuit boards 10 on which the wavelength conversion layer 20 and the barrier layer 8 are formed is, with a third blade 28, divided into pieces such that the translucent circuit board 10 and the barrier layer 8 partially overlap with each other and that the barrier layer 8 sags without the wavelength conversion layer 20 being exposed.

Figure 7G:
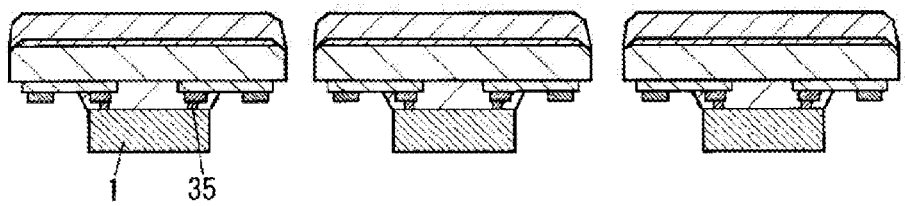

Finally, referring to FIG. 7G, a light-emitting element 1 is mounted such that each interconnection 32 of the translucent circuit board 10 is electrically connected to a corresponding one of protruding electrodes 35 of the light-emitting element 1.

In the present embodiment, since the translucent circuit board (translucent base) 10 is also made from the flat plate, the translucent members 9 each including the wavelength conversion layer 20 can be formed at once, and therefore the light-emitting devices can be provided with high mass productivity.

Fourth Embodiment

Figure 8:
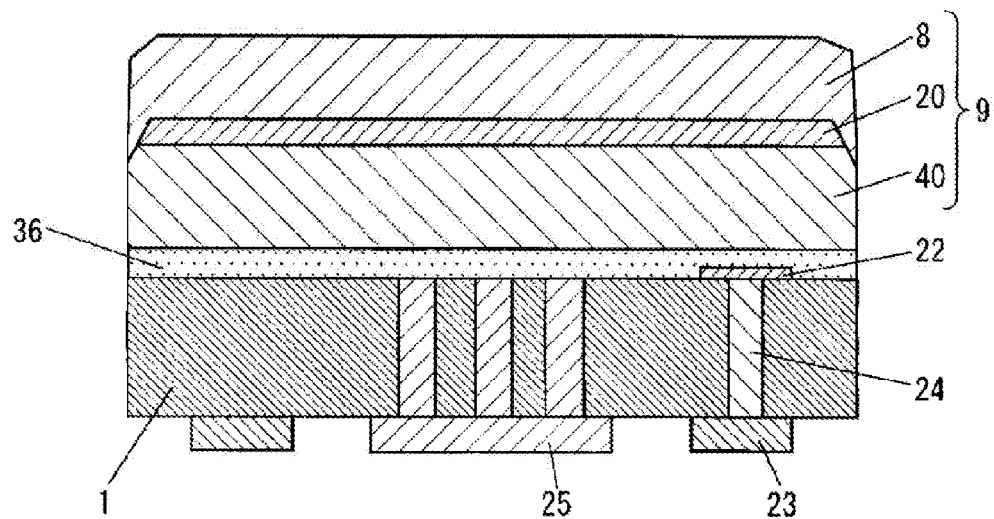
FIG. 8 is a cross-sectional view illustrating a light-emitting device of a fourth embodiment of the present disclosure.

FIG. 8 is a cross-sectional view illustrating a light-emitting device of a fourth embodiment of the present disclosure. In the fourth embodiment, the dimensions of the light-emitting device are smaller than those of the third embodiment in terms of an area. A third translucent member 9 and a light-emitting element 1 have the substantially same planar size. The light-emitting device of this type is called as a "chip size package (CSP)."

More specifically, the third translucent member 9 having a size equal to or greater than that of the light-emitting element 1 and being larger than an emission region of the light-emitting element 1 is formed on an emission surface side of the light-emitting element 1. The third translucent member 9 is formed such that a flat plate-shaped translucent base 40, a wavelength conversion layer 20, and a barrier layer 8 are stacked on each other. For example, resin glass, acrylic resin, or a film may be used for the translucent base 40. The wavelength conversion layer 20 is formed on an upper surface of the translucent base 40. The barrier layer 8 are formed on an upper surface of the wavelength conversion layer 20. Resin or a film may be used for the barrier layer 8. An electrode 22 is formed on a surface of the light-emitting element 1 on which the third translucent member 9 is disposed. Terminals 23 are formed on a surface of the light-emitting element 1 opposite to the third translucent member 9. The electrode 22 and the terminal 23 are electrically connected together through an interconnection 24 such as a through-hole via. The wavelength conversion layer 20 sandwiched between the translucent base 40 and the barrier layer 8 has such a structure that the translucent base 40 and the barrier layer 8 partially overlap with each other without a circumferential edge of the wavelength conversion layer 20 being exposed.

A heat dissipation pattern 25 is preferably formed on the light-emitting element 1 in addition to the terminals 23. For higher heat dissipating properties, a required thermal design can be realized in such a manner that the heat dissipation pattern 25 is formed on the surface of the light-emitting element 1 on which the terminal 23 is formed and that the number and/or diameter of through-holes formed in the light-emitting element 1 is changed depending on a required heat dissipation capacity. For example, a Cu interconnection may be used as the heat dissipation pattern 25.

For the light-emitting element 1, the translucent base 40, and the wavelength conversion layer 20, the materials etc. described in the first and second embodiments may be used.

The entirety of the wavelength conversion layer 20 is covered by the translucent base 40 and the barrier layer 8 so as to be sealed in the light-emitting device, and therefore the wavelength conversion layer 20 is not exposed to the outside of the light-emitting device (i.e., not exposed to external air). Since the wavelength conversion layer 20 is sealed as just described, airtightness can be ensured even for a wavelength conversion layer of a light-emitting device having low oxidation resistance and low moisture resistance. As a result, lowering of the oxidation resistance and the moisture resistance of the wavelength conversion layer can be reduced, and the light-emitting device can be manufactured with high quality.

FIGS. 9A-9E are cross-sectional views illustrating the steps of manufacturing the light-emitting device of the fourth embodiment of the present disclosure.

Figure 9A:
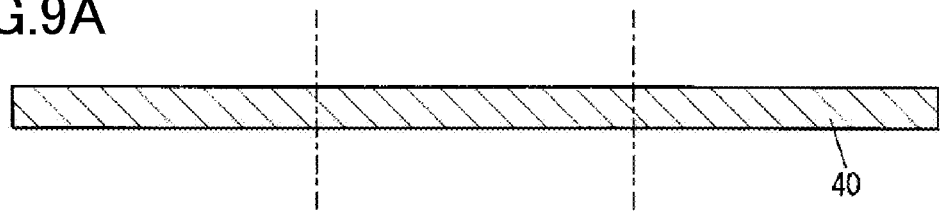

First, referring to FIG. 9A, an integrated body of a plurality of translucent bases 40 in an undivided state is prepared. For example, glass, acrylic resin, or a film may be used for the translucent base 40.

Figure 9B:
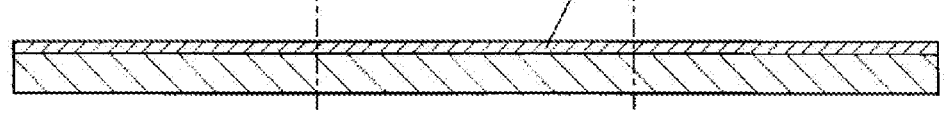

Next, referring to FIG. 9B, a wavelength conversion layer 20 is formed on an upper surface of the integrated body of the translucent bases 40.

Figure 9C:
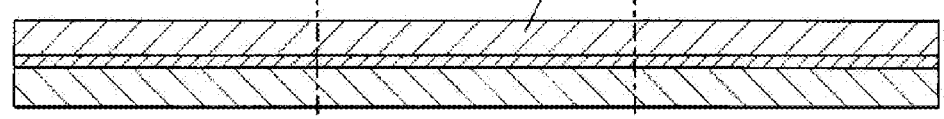

Then, referring to FIG. 9C, an upper surface of the wavelength conversion layer 20 is covered by a barrier layer 8.

Figure 9D:
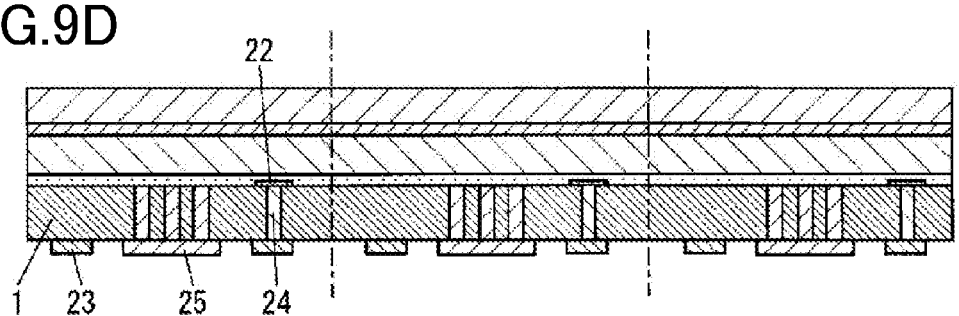
Figure 9D:
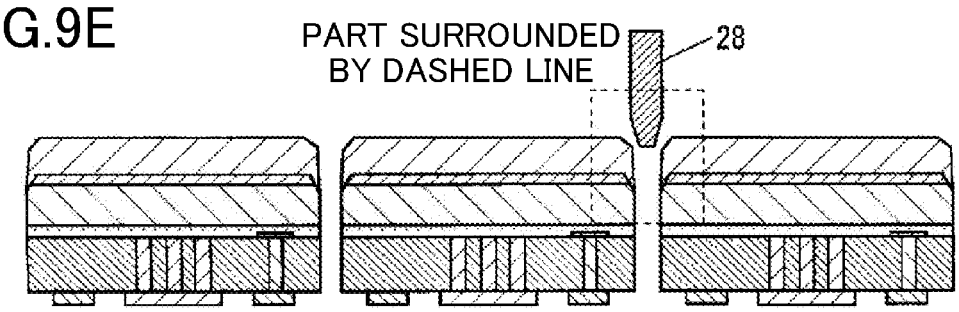

Then, referring to FIG. 9D, the integrated body to be third translucent members 9 is bonded onto a wafer including a plurality of light-emitting elements 1 in an undivided state.

Finally, referring to FIG. 9E, the integrated body of the third translucent members 9 is, together with the wafer including the light-emitting elements 1, divided into pieces with a third blade 28 such that the translucent base 40 and the barrier layer 8 partially overlap with each other without the wavelength conversion layer 20 being exposed.

In the present embodiment, since the translucent base 40 is also made from the flat plate, the third translucent members 9 each including the wavelength conversion layer 20 can be formed at once, and therefore the light-emitting devices can be provided with high mass productivity.

Figure 10A:
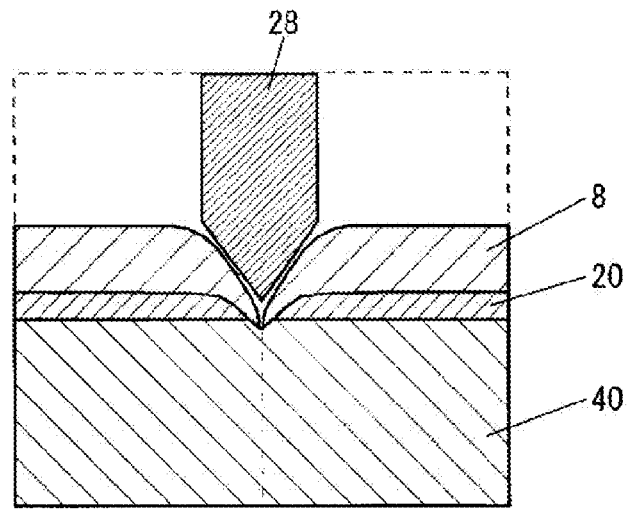
FIGS. 10A-10C are views illustrating the method for forming a translucent member used for the light-emitting devices of the third and fourth embodiments of the present disclosure.
Figure 10B:
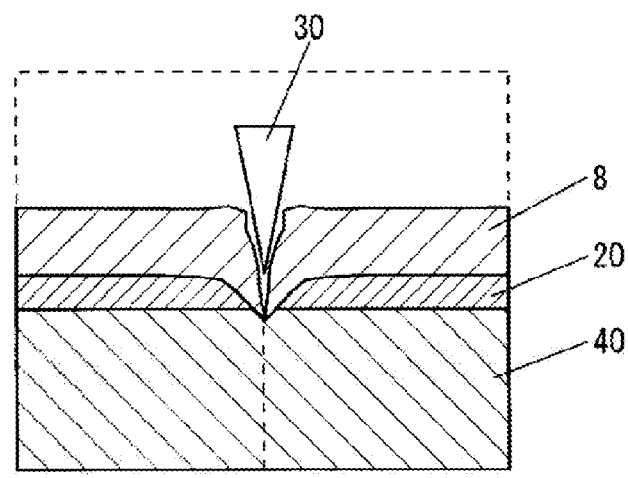
Figure 10C:
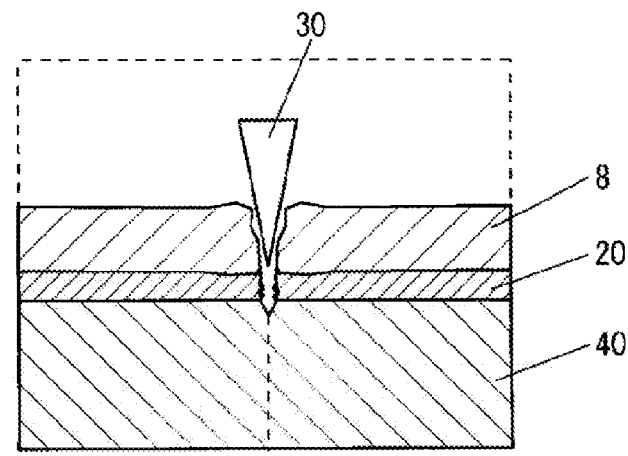

FIGS. 10A-10C are cross-sectional views illustrating the method for dividing the bonded body of the integrated body of the third translucent members 9 and the wafer including the light-emitting elements 1 into pieces without the wavelength conversion layer 20 being exposed, and are enlarged views of part of FIG. 9E surrounded by a dashed line. Note that this method is also applicable to manufacturing of the light-emitting device of the third embodiment.

First, the method for dividing the bonded body into pieces such that the translucent base 40 and the barrier layer 8 partially overlap with each other and that the barrier layer 8 sags without the wavelength conversion layer 20 being exposed will be described in more detail with reference to FIG. 10A.

First, the bonded body is, with the third blade 28, cut from a side close to the barrier layer 8 along a cutting plane. At this point, the barrier layer 8 sags, at a cut end thereof, due to pressure and friction toward the translucent base 40 by rotation and cutting of the third blade 28. The sagging part of the barrier layer 8 comes into contact with the translucent base 40, thereby sealing the wavelength conversion layer 20 with the barrier layer 8 and the translucent base 40. Such processing allows the wavelength conversion layer 20 not to be exposed to air, and protects the wavelength conversion layer 20 from air and moisture.

Cutting may be performed not using the blade but using a metal punch used typically for, e.g., pressing. In such a case, a suitable change in shape of a blade edge of the punch is required as conditions for forming the sagging part of the barrier layer 8 at the cut end thereof. Unlike cutting with the blade, great abrasion heat is not generated. Thus, the overlap part of the barrier layer 8 and the translucent base 40 may be mechanically sealed, or thermal processing may be, if difficult, further performed to bond the barrier layer 8 and the translucent base 40 at the overlap part thereof.

Then, the method, which is different from the method illustrated in FIG. 10A, for dividing the bonded body into pieces such that the barrier layer 8 sags without the wavelength conversion layer 20 being exposed will be described with reference to FIG. 10B. Referring to FIG. 10B, the wavelength conversion layer 20 is formed on the translucent base 40, and the barrier layer 8 is further formed on the wavelength conversion layer 20. In this example, the bonded body is cut using a laser beam 30 along the cutting plane. For example, a $CO_2$ laser, a YAG laser, or an excimer laser may be used as the laser beam 30. Since the laser burns off the material with heat, conditions are adjusted to melt the barrier layer 8 and form the sagging part of the barrier layer 8. The bonded body is burned off to the extent that the sagging part of the barrier layer 8 overlaps with the translucent base 40 and sticks to the translucent base 40.

Next, the method, which is different from the methods illustrated in FIGS. 10A and 10B, for dividing the bonded body into pieces without the wavelength conversion layer 20 being exposed will be described with reference to FIG. 10C. Unlike the methods for forming the sagging part of the barrier layer 8 as illustrated in FIGS. 10A and 10B, FIG. 10C illustrates the method for thermally curing only a surface of the cut end of the wavelength conversion layer 20 to form a cured layer at the circumferential edge of the wavelength conversion layer 20. That is, the layer burned and cured by melt heat of the laser beam 30 is formed at the edge of the wavelength conversion layer 20. As a result, the wavelength conversion layer 20 inside the cured layer is not exposed.

Although not shown in the figure, the following method may be employed as another application of the present embodiment. The wavelength conversion layer 20 may be prevented from being exposed to air and moisture in such a manner that a coating is instantaneously formed on the surface of the wavelength conversion layer 20 by laser heat or high-temperature plasma to prevent an inner part of the wavelength conversion layer 20 from being completely cured. In such a case, it is not necessary that the barrier layer 8 is melted to seal the wavelength conversion layer 20, and the barrier layer 8 itself is not necessary if the coating can be formed on the surface of the wavelength conversion layer 20. In this case, the material of the wavelength conversion layer 20 should contain a curable material so that the coating can be instantaneously formed on the surface of the wavelength conversion layer 20 by high-temperature plasma.

The translucent member 9 as described in the third and fourth embodiments may be mounted on the frame body 3 as described in the first and second embodiments. Needless to say, the translucent member 9 of the third embodiment is applicable to the fourth embodiment, and vice versa.

The present disclosure is not limited to the light-emitting device, and is applicable to general types of electronic components requiring airtightness in, e.g., the field of sensors and optical devices. Examples of the electronic components include infrared sensors, image sensors, and photo ICs. In the case of the infrared sensor, e.g., an alpha-ray blocking film, a wavelength blocking film, or an antireflective film may be used instead of using the wavelength conversion layer 20. In the case of the photo IC or the image sensor, e.g., an alpha-ray blocking film, a wavelength blocking film, or an antireflective film may be used instead of using the wavelength conversion layer 20. A mixture of inorganic/organic resin and powder of, e.g., titanium oxide, magnesium fluoride, aluminum oxide, zirconium oxide, tantalum oxide, or silicon dioxide may be used for the antireflective film. In the case of the alpha-ray blocking film or the wavelength blocking film, examples of the method for vapor-depositing an alpha-ray blocking film or a wavelength blocking film on glass or a film include sputtering and electron beam deposition. A mixture of inorganic/ organic resin, tin-doped indium oxide (ITO), and antimony tin oxide (ATO) is used for the alpha-ray blocking film and the wavelength blocking film.

According to the present disclosure, the light-emitting device suitably used for a backlight source of an electronic display or a fluorescent lamp can be realized with less degradation of the wavelength conversion layer.

What is claimed is:

1. A light-emitting device including a light-emitting element and a wavelength conversion layer, comprising:
    a translucent member including:
        a translucent base, and
        the wavelength conversion layer formed on the translucent base, and
    a frame body formed with a recess,
    wherein the wavelength conversion layer does not contact the light-emitting element, and is sealed in the light-emitting device,
    the light-emitting element is mounted in the recess,
    the translucent member is mounted on the frame body so as to cover the recess,
    the translucent member is bonded to the frame body with an adhesive material,
    a side surface of the wavelength conversion layer is covered by the adhesive material, and
    a cutout is formed in an end part of the translucent base.

2. The light-emitting device of claim 1, wherein the wavelength conversion layer contains semiconductor fluorescent particles.

3. The light-emitting device of claim 1, wherein the cutout is filled with the adhesive material.

4. The light-emitting device of claim 1, wherein the wavelength conversion layer contacts an upper surface of the frame body.

5. The light-emitting device of claim 1, wherein the recess is filled with gas other than oxygen.

6. A light-emitting device including a light-emitting element and a wavelength conversion layer, comprising:
    a translucent member including:
        a translucent base, and
        the wavelength conversion layer formed on the translucent base,
    wherein the wavelength conversion layer does not contact the light-emitting element, and is sealed in the light-emitting device,
    the translucent member includes a barrier layer,
    the barrier layer is formed on a side of the wavelength conversion layer opposite to the translucent base,
    the wavelength conversion layer is sealed with the translucent base and the barrier layer,
    the translucent base is a translucent circuit board, and
    the light-emitting element is electrically connected to an interconnection formed on the translucent base.

7. The light-emitting device of claim 6, wherein
    a through-hole is formed in the translucent base,
    the through-hole is filled with the wavelength conversion layer, and
    a heat dissipation pattern is formed on the translucent base so as to cover the through-hole.

8. The light-emitting device of claim 6, wherein a cured layer is formed at a side surface of the wavelength conversion layer.

9. A light-emitting device including a light-emitting element and a wavelength conversion layer, comprising:
    a translucent member including:
        a translucent base, and
        the wavelength conversion layer formed on the translucent base,
    wherein the wavelength conversion layer does not contact the light-emitting element, and is sealed in the light-emitting device,
    the translucent member includes a barrier layer,
    the barrier layer is formed on a side of the wavelength conversion layer opposite to the translucent base,
    the wavelength conversion layer is sealed with the translucent base and the barrier layer,
    the light-emitting element is bonded to the translucent member, and
    a side surface of the light-emitting element and a side surface of the translucent member are flush with each other.

10. The light-emitting device of claim 9, wherein a heat dissipation pattern is formed on the light-emitting element.

11. The light-emitting device of claim 9, wherein a cured layer is formed at a side surface of the wavelength conversion layer.

* * * * *